United States Patent [19]

Littman et al.

[11] Patent Number: 5,059,861

[45] Date of Patent: Oct. 22, 1991

[54] ORGANIC ELECTROLUMINESCENT DEVICE WITH STABILIZING CATHODE CAPPING LAYER

[75] Inventors: Jon E. Littman, Honeoye Falls; Michael Scozzafava, Rochester, both of N.Y.

[73] Assignee: Eastman Kodak Company, Rochester, N.Y.

[21] Appl. No.: 557,847

[22] Filed: Jul. 26, 1990

[51] Int. Cl.$^5$ .................. H05B 33/26; B32B 15/04
[52] U.S. Cl. .................. 313/503; 313/504; 428/457
[58] Field of Search .................. 313/503, 504, 506; 428/457

[56] References Cited

U.S. PATENT DOCUMENTS

| | | | |
|---|---|---|---|
| 3,530,325 | 9/1970 | Mehl et al. | 313/108 |
| 3,621,321 | 11/1971 | Williams | 313/108 A |
| 4,356,429 | 10/1982 | Tang | 313/502 |
| 4,539,507 | 9/1985 | Van Slyke et al. | 313/504 |
| 4,719,152 | 1/1988 | Ohta et al. | 313/506 X |
| 4,720,432 | 1/1988 | Van Slyke et al. | 428/457 |
| 4,769,292 | 9/1988 | Tang et al. | 428/690 |
| 4,885,211 | 12/1989 | Tang et al. | 428/457 |

*Primary Examiner*—Sandra L. O'Shea
*Attorney, Agent, or Firm*—Carl O. Thomas

[57] ABSTRACT

An organic electroluminescent device is disclosed which is protected from dark spot formation. The device is comprised of, in sequence, a support, an anode, an organic electroluminescent medium, and a cathode containing a plurality of metals other than alkali metals. The cathode is comprised of a capping layer containing at least one alkaline earth or rare earth metal and, interposed between the capping layer and the organic electroluminescent medium, an electron injecting layer containing at least one metal having a work function of less than 4.0, but exhibiting a higher work function than the alkaline earth or rare earth metals in the capping layer.

11 Claims, 1 Drawing Sheet

ORGANIC ELECTROLUMINESCENT DEVICE WITH STABILIZING CATHODE CAPPING LAYER

FIELD OF THE INVENTION

This invention relates to organic electroluminescent devices. More specifically, this invention relates to devices which emit light from a current conducting organic layer.

BACKGROUND OF THE INVENTION

Electroluminescent devices (hereinafter also referred to as EL devices) contain spaced electrodes separated by an electroluminescent medium that emits electromagnetic radiation, typically light, in response to the application of an electrical potential difference across the electrodes. The electroluminescent medium must not only be capable of luminescing, but must also be capable of fabrication in a continuous form (i.e., must be pin hole free) and must be sufficiently stable to facilitate fabrication and to support device operation.

Initially organic EL devices were fabricated using single crystals of organic materials, as illustrated by Mehl et al U.S. Pat. No. 3,530,325 and Williams U.S. Pat. No. 3,621,321. Single organic crystal EL devices were relatively difficult to fabricate and further did not readily lend themselves to thin film constructions.

In recent years preferred organic EL devices have been constructed employing thin film deposition techniques. Using an anode as a device support, the organic electroluminescent medium has been deposited as one or a combination of thin films followed by the deposition of a cathode, also formed as a thin film deposition. Thus, starting with the anode structure, it is possible to form the entire active structure of an organic EL device by thin film deposition techniques. As employed herein the term "thin film" refers to layer thicknesses of less than 10 $\mu$m, with layer thicknesses of less than about 5 $\mu$m being typical. Examples of organic EL devices containing organic electroluminescent medium and cathode constructions formed by thin film deposition techniques are provided by Tang U.S. Pat. No. 4,356,429, VanSlyke et al U.S. Pat. Nos. 4,539,507 and 4,720,432, and Tang et al U.S. Pat. Nos. 4,769,292 and 4,885,211.

While the art has encountered little difficulty in constructing fully acceptable stable anodes for internal junction organic EL devices, cathode construction has been a matter of extended investigation. In selecting a cathode metal, a balance must be struck between metals having the highest electron injecting efficiencies and those having the highest levels of stability. The highest electron injecting efficiencies are obtained with alkali metals, which are too unstable for convenient use, while metals having the highest stabilities show limited electron injection efficiencies and are, in fact, better suited for anode construction.

Despite improvements in the construction of organic EL devices, a persistent problem has been dark spot formation in environments in which the organic EL device is exposed to some level of moisture in the ambient atmosphere. Microscopic analysis of organic EL devices exhibiting dark spot behavior has revealed oxidation of the cathode occurring at its interface with the organic electroluminescent medium. It is believed that the oxidation of the cathode metal at its interface with the organic electroluminescent medium creates a resistive barrier to current flow in affected areas of the organic EL device. Without current flow in an area of the organic EL device, no electroluminescence can occur, and the result is seen as a dark spot when other areas of organic EL device are emitting.

Tang et al U.S. Pat. No. 4,885,211 teaches to form the cathodes of organic EL devices of a combination of metals, with at least 50 percent (atomic basis) of the cathode being accounted for by a metal having a work function of less than 4.0 eV. Tang et al in Example 3 demonstrates a 1:1 weight ratio silver-europium electrode.

RELATED PATENT APPLICATIONS

Van Slyke et al (I) U.S. Ser. No. 558,285, concurrently filed and commonly assigned, titled ELECTROLUMINESCENT DEVICE WITH IMPROVED CATHODE, discloses an organic EL device comprised of a cathode containing a combination of magnesium and aluminum.

Van Slyke et al (II) U.S. Ser. No. 561,552, concurrently filed and commonly assigned, titled ELECTROLUMINESCENT DEVICE WITH ORGANIC ELECTROLUMINESCENT MEDIUM, discloses an organic electroluminescent medium including a hole injecting and transporting zone containing an aromatic tertiary amine containing at least two tertiary amine moieties and including attached to a tertiary amine nitrogen atom an aromatic moiety containing at least two fused aromatic rings.

SUMMARY OF THE INVENTION

The present invention has as its purpose to curtail the emergence of dark spots in organic EL devices.

In one aspect this invention is directed to an organic electroluminescent device comprised of, in sequence, a support, an anode, an organic electroluminescent medium, and a cathode containing a plurality of metals other than alkali metals. The device is characterized in that the cathode is comprised of a capping layer containing at least one alkaline earth or rare earth metal and, interposed between the capping layer and the organic electroluminescent medium, an electron injecting layer containing at least one metal having a work function of less than 4.0, but exhibiting a higher work function than the alkaline earth or rare earth metals in the capping layer.

It is a further object of the invention to provide an organic EL device having improved cathode characteristics that is compatible with formation by thin film deposition techniques.

Figure 1:
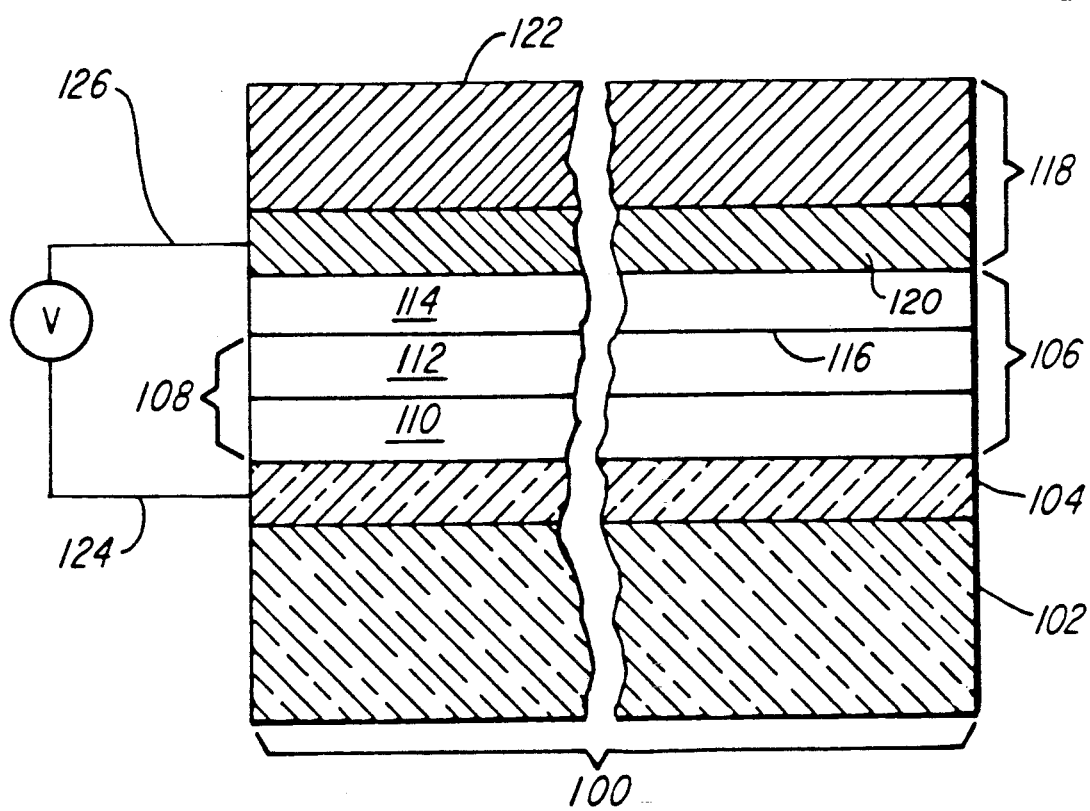
FIG. 1 is schematic diagram of an organic EL device according to the invention.

The drawings are necessarily of a schematic nature, since the thicknesses of the individual layers are too thin and thickness differences of the various elements are too greater to permit depiction to scale or to permit convenient proportionate scaling.

DESCRIPTION OF PREFERRED EMBODIMENTS

An organic electroluminescent (EL) device 100 is shown in FIG. 1 consisting of a light transmissive support 102 onto which is coated a light transmissive anode 104. Overlying the anode is an organic electroluminescent medium 106. As shown, the organic electroluminescent medium is divided into (1) a hole injecting and transporting zone 108, which is further divided into (a) a hole injecting layer 110 contacting the anode and (b) an overlying hole transporting layer 112, and (2) an electron injecting and transporting zone 114 forming a junction 116 with the hole transporting layer.

A cathode 118 consisting of an electron injecting layer 120 and a capping layer 122 overlies the organic electroluminescent medium. The electron injecting layer forms an interface with the electron injecting and transporting zone of the organic electroluminescent medium.

In use the anode 104 and cathode 118 are connected to an external power source V by conductors 124 and 126, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The organic EL device can be viewed as a diode which is forward biased when the anode is at a higher potential than the cathode. Under these conditions injection of holes occurs from the anode into the hole injecting layer 110 of the hole injecting and transporting zone 106. The holes are transported across the hole transporting layer 112 and across the junction 116 into the electron injecting and transporting zone 114. Concurrently electrons are injected from the cathode 118 into the electron injecting and transporting zone 114. When a migrating electron drops from its conduction band potential to a valence band in filling a hole, energy is released as light. Depending upon the choice of alternative constructions, the released light can be emitted from the organic electroluminescent medium through one or more edges of the organic electroluminescent medium separating the electrodes, through the anode and support, through the cathode, or through any combination of the foregoing. Since the organic electroluminescent medium is quite thin, it is usually preferred to emit light through one of the two electrodes. In the preferred form of the EL device shown the anode and support are specifically constructed to be light transmissive, thereby facilitating emission through these elements.

Reverse biasing of the electrodes reverses the direction of mobile charge migration, depletes the organic electroluminescent medium of mobile charge carriers, and terminates light emission. When an AC power source is employed, the internal junction organic EL devices are forward biased during a portion of each period and reverse biased during the remaining portion of the period.

To allow the organic EL device to operate efficiently the cathode must contain at least one metal having a relative low (less than 4.0 eV) work function in contact with the organic electroluminescent medium. Therefore, the lowest work function metal present in the cathode at the interface is particularly susceptible to oxidation. The presence of moisture in the ambient atmosphere surrounding the organic EL device has been observed to lead to oxidation of the cathode low work function metal at its interface with the organic electroluminescent medium, even when a low work function metal is present in only a limited amount or is overcoated with a higher work function metal. While the susceptibility of the cathode to oxidation is inherent in the materials and operation of the cathode of an efficient organic EL device, there are additional contributing factors. In constructing organic EL devices by thin film forming techniques, microchannels (microscopic local disruptions) are believed to be present in the cathodes that allow moisture migration through the cathode to its interface with the organic electroluminescent medium.

The present invention is based on the discovery of a cathode construction for an organic EL device which achieves both high levels of efficiency and improved uniformity of light emission from an organic EL device in the presence of ambient moisture—i.e., curtailed dark spot emergence over time.

The high levels of efficiency are achieved by employing a cathode electron injecting layer that contains a mixture of metals, at least one of which has a low ($<4.0$ eV) work function (but excluding, of course, the alkali metals, which are too unstable for convenient use). In this respect the invention is implementing the teachings of Tang et al U.S. Pat. No. 4,885,211, cited above and here incorporated by reference, but with the very significant difference that the low work function metal need not form more than a minor amount of the electron injecting layer of the cathode. Preferred cathode electron injecting layers contain at least 0.05 percent (optimally at least 0.10 percent) of the low work function metal. (As herein employed all percentages are weight percentages based on total weight, unless otherwise indicated.) The high ($>4.0$ eV) work function metal or metals in the cathode electron injecting layer can be employed in any convenient concentration. Deposition benefits can be realized when the high work function metal accounts for as little as 1 percent of the cathode electron injecting layer, with high work function metal concentrations in this layer preferably being at least 2 percent. The high work function metal can account for the entire content of the electron injecting layer not provided for by the low work function metal, with high work function metal concentrations of in excess of 80 percent and even in excess of 90 percent being specifically contemplated.

To improve the uniformity of light emission in the presence of ambient moisture the cathode is provided with a capping layer. Capping layers of aluminum, which has a work function of about 4.25 eV, have been demonstrated to be ineffective in curtailing dark spot formation. Similarly, capping layers of organic materials, such as those used to form the organic electroluminescent medium, have also been demonstrated to be ineffective in curtailing dark spot formation.

Quite surprisingly, it has been discovered that a cathode construction having a capping layer that contains an alkaline earth and/or rare earth metal employed in combination with an electron injecting layer which contains at least one metal having a low ($<4.0$ eV) work function, but a higher work function than the lowest work function metal in the capping layer—i.e., a lower function than the alkaline earth and/or rare earth metal in the capping layer, protects the organic EL device from dark spot emergence in the presence of moisture. It is surprising that adding to the cathode construction one or more metals having a lower work function than the lowest work function metal in the electron injecting layer of the cathode enhances device stability. Since alkaline earth and rare earth metals have work functions that are intermediate between metals commonly employed in cathode construction and, in most instances, the work functions of alkali metals, it would be reasonable to conclude that the addition of alkaline earth and/or rare earth metals to cathode construction would degrade device stability.

It is believed that the cathode capping layers containing at least one alkaline earth or rare earth are effective to curtail dark spot formation because it is oxidation at the interface of the cathode electron injecting layer and the organic electroluminescent medium that is primarily responsible for dark spot emergence, rather than oxidation of portions of the cathode removed spatially remote from this interface. By confining the alkaline earth or rare earth metal to a capping layer out of direct contact with the organic electroluminescent medium, the alkaline earth or rare earth metal is located to intercept and react with moisture that would otherwise reach the interface of the cathode and the organic electroluminescent medium. Oxidation of the alkaline earth or rare earth metal does not degrade device efficiency, since it is the lowest work function metal in contact with the organic electroluminescent medium that controls device efficiency. Similarly, oxidation of the alkaline earth or rare earth metal does not promote dark spots, since the site of oxidation is removed from the electron injecting interface with the organic electroluminescent medium.

To be effective in curtailing dark spot formation the capping layer is at least 500 Å (preferably at least 1000 Å and optimally at least 2000 Å) in thickness. Any convenient capping layer thickness can be employed. For example, using thin film deposition techniques, capping layer thicknesses of up to about 20 μm can be readily formed. Generally the full advantages of the invention are realized with capping layer thicknesses of at least 5 μm, with maximum fused metal particle layer thicknesses of about 2 μm being preferred.

The foregoing capping layer thicknesses are predicated on the assumption of one or a combination of alkaline earth and rare earth metals accounting for at least 80 percent and optimally at least 90 percent of the capping layer. It is generally preferred that the capping layer consist essentially of one or a combination of alkaline earth and rare earth metals. However, it is recognized that the presence of one or more other metals in minor amounts may be advantageous to facilitate formation of smooth capping layers, depending upon the layer formation technique employed.

In one specifically preferred form the electron injecting layer of the cathode can be identical to any of the cathodes satisfying the requirements of Tang et al U.S. Pat. No. 4,885,211. Specifically, the Mg:Ag cathodes of Tang et al U.S. Pat. No. 4,885,211 constitute one preferred electron injecting cathode layer construction, but the magnesium can be present in the ranges noted above rather than in concentrations of greater than 50 percent, as suggested by Tang et al.

In another preferred form the cathode electron injecting layer can be comprised of aluminum and magnesium. The cathode electron injecting layer can take the form of the aluminum and magnesium cathodes that are the subject matter of the VanSlyke et al (I) concurrently filed patent application cited above.

In the foregoing preferred cathode electron injecting layer constructions magnesium is employed, but it is recognized that other metals in the work function range of 3.9 eV to 3.5 eV can be substituted. Among metals in this work function range beryllium, manganese, gallium, indium, hafnium and thallium, are specifically preferred. Any one or combination of these metals can be substituted for or employed incombination with magnesium.

The cathode capping layer can be formed of any convenient alkaline earth or rare earth metal or combination of these metals, provided that any metal so chosen has a work function less than that of any metal in the cathode electron injecting layer. For example, when the lowest work function metal is in the range of from 4.0 eV to 3.5 eV, any rare earth metal can be present in the capping layer, since all rare earth metals having a work function of less than 3.5 eV. As employed herein, the term "rare earth" refers to the Group 3 metals scandium, yttrium and the lanthanide series of elements.

All of the alkaline earth metals have a work function of less than 3.0 eV, except beryllium and magnesium. It is therefore apparent that beryllium or magnesium can be employed either in the electron injecting layer or in the capping layer, depending on the other metal or metals to employed in combination. However, since beryllium has a work function of 3.9 eV, there are relatively few metals having a higher work function, but still less than 4.0 eV that can employed in combination to allow the beryllium to be located in the capping layer. On the other hand, the preferred Mg containing electron injecting layers noted above can be employed in combination with a capping layer containing any alkaline earth and/or rare earth metal, provided that at least one of the alkaline earth and rare earth metals is not magnesium. Conversely, when the electron injecting layer contains as its lowest work function element a metal, such as indium, gallium or indium, having a higher work function than magnesium, the advantages of the invention can be realized by employing magnesium in the capping layer.

The rare earth elements can be divided into two categories: (1) those having a work function in the range of from 3.0 to 3.5 eV, such as scandium, yttrium, lanthanum neodymium, samarium, gadolinium, terbium, dysprosium, erbium, holmium, thulium and lutetium, and (2) those having a work function in the range of from 2.5 to 3.0 eV, such as cerium, praseodymium, europium and ytterbium. It is possible to locate the rare earths in category (1) in the cathode injecting layer while locating the rare earths in category (2) in the capping layer.

It is apparent that still other combinations are possible by choosing the lowest work function metal to be located in the capping layer and another, higher work function metal, but one having a work function of less than 4.0 eV, to be present in the cathode injecting layer.

The anode of the organic EL device can take any convenient conventional form. Typically the anode is constructed of one or a combination of metals having a work function in excess of 4.0 eV. Metals having work functions >4.0 eV are listed by Tang et al U.S. Pat. No. 4,885,211, incorporated by reference above. When, as is preferred, luminescence is intended to occur through the anode, it is preferred to construct the anode of one or a combination of light transmissive metal oxides, such as indium oxide, tin oxide or, optimally, indium tin oxide (ITO).

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent (or substantially transparent) materials are useful. In most instances the light transmissive layers or elements of the organic EL device are also colorless or of neutral optical density—that is, exhibit no markedly higher absorption of light in one wavelength range as compared to another. However, it is, of course, recognized that light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

The organic electroluminescent medium can be chosen from any one or combination of the organic materials taught to form the organic electroluminescent medium of the organic EL devices disclosed by Tang U.S. Pat. No. 4,356,429, VanSlyke et al U.S. Pat. No. 4,539,507, Tang et al U.S. Pat. Nos. 4,769,292 and 4,885,211, each here incorporated by reference. Although the most advantageous constructions are those that employ the zones and layers described above in connection device 100, the organic electroluminescent medium can be a unitary layer.

To achieve high levels of organic EL device efficiency it is contemplated to construct the organic electroluminescent medium of at least two different zones, an electron injecting and transporting zone, which is typically a single layer, and a hole injecting and transporting zone. The hole injecting and transporting zone can be constructed also of a single layer, but it is most efficiently constructed of a hole injecting layer and a hole transporting layer.

In a preferred form of the invention a layer containing a porphyrinic compound forms the hole injecting layer of the internal junction organic EL device. A porphyrinic compound is any compound, natural or synthetic, which is derived from or includes the porphyrin structure. Any of the porphyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (I):

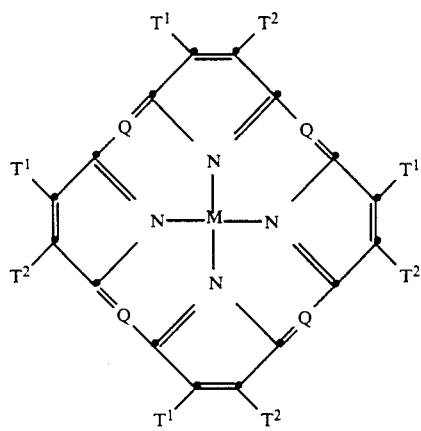

wherein

Q is —N= or —C(R)=;

M is a metal, metal oxide, or metal halide;

R is hydrogen, alkyl, aralkyl, aryl, or alkaryl, and $T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred form the porphyrinic compounds differe from those of structural formula (I) by substitution of two hydrogen for the metal atom, as indicated by formula (II):

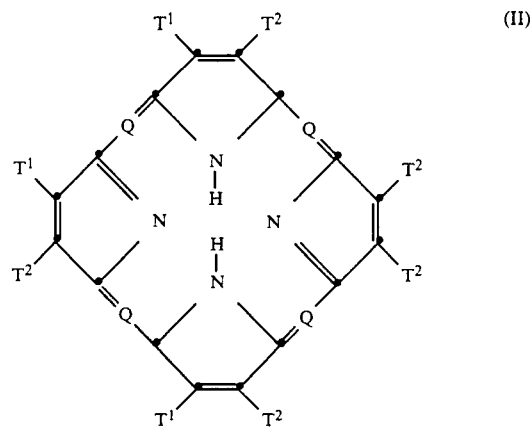

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

| | |
|---|---|
| PC-1 | Porphine |
| PC-2 | 1,10,15,20-Tetraphenyl-21H,23H-porphine copper (II) |
| PC-3 | 1,10,15,20-Tetraphenyl-21H,23H-porphine zinc (II) |
| PC-4 | 5,10,15,20-Tetrakis(pentafluorophenyl)-21H,23H-porphine |
| PC-5 | Silicon phthalocyanine oxide |
| PC-6 | Aluminum phthalocyanine chloride |
| PC-7 | Phthalocyanine (metal free) |
| PC-8 | Dilithium phthalocyanine |
| PC-9 | Copper tetramethylphthalocyanine |
| PC-10 | Copper phthalocyanine |
| PC-11 | Chromium phthalocyanine fluoride |
| PC-12 | Zinc phthalocyanine |
| PC-13 | Lead phthalocyanine |
| PC-14 | Titanium phthalocyanine oxide |
| PC-15 | Magnesium phthalocyanine |
| PC-16 | Copper octamethylphthalocyanine |

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

wherein
$Q^1$ and $Q^2$ are independently aromatic tertiary amine moieties and
G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

where
$R^1$ and $R^2$ each independently represents a hydrogen atom, an aryl group or alkyl group or $R^1$ and $R^2$ together represent the atoms completing a cycloalkyl group and
$R^3$ and $R^4$ each independently represents an aryl group which is in turn substituted with a diaryl substituted amino group, as indicated by structural formula (V):

wherein $R^5$ and $R^6$ are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraaryldiamines include those represented by formula (VI).

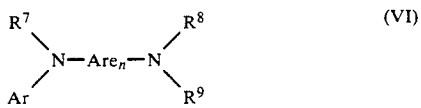

wherein
Are is an arylene group,
n is an integer of from 1 to 4, and
Ar, $R^7$, $R^8$, and $R^9$ are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Following the teachings of VanSlyke et al (II), cited above, it is possible to achieve higher organic EL device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0–50 hours) and long term (0–300+ hours) of operation are achieved when the aromatic tertiary amines are those which (1) are comprised of at least two tertiary amine moieties and (2) include attached to a tertiary amine nitrogen atom an aromatic moiety containing at least two fused aromatic rings. The following is a listing of exemplary aromatic compounds containing at least two fused aromatic rings and from 10 to 24 ring carbon atoms:

Naphthalene,
Azulene,
Heptalene,
as-Indacene,
s-Indacene,
Acenaphthylene,
Phenalene,
Phenanthrene,
Anthracene,
Fluoranthrene,
Acephenathrylene,
Aceantrylene,
Triphenylene,
Pyrene,
Chrysene,
Naphthacene,
Pleiadene,
Picene,
Perylene,
Pentaphene,
Hexaphene,
Rubicene, and
Coronene.

The fused aromatic ring moieties of the tertiary amines preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:

| ATA-1 | 1,1-Bis(4-di-p-tolylaminophenyl)-cyclohexane |
|---|---|
| ATA-2 | 1,1-Bis(4-di-p-tolylaminophenyl)-4-phenylcyclohexane |
| ATA-3 | 4,4'-Bis(diphenylamino)quadriphenyl |
| ATA-4 | Bis(4-dimethylamino-2-methylphenyl)-phenylmethane |
| ATA-5 | N,N,N-Tri(p-tolyl)amine |
| ATA-6 | 4-(di-p-tolylamino)-4'-[4(di-p-tolyl-amino)styryl]stilbene |
| ATA-7 | N,N,N',N'-Tetra-p-tolyl-4,4'-diamino-biphenyl |
| ATA-8 | N,N,N',N'-Tetraphenyl-4,4'-diamino-biphenyl |
| ATA-9 | N-Phenylcarbazole |
| ATA-10 | Poly(N-vinylcarbazole) |
| ATA-11 | 4,4'-Bis[N-(1-naphthyl)-N-phenylamino]-biphenyl |
| ATA-12 | 4,4''-Bis[N-(1-naphthyl)-N-phenylamino]-p-terphenyl |
| ATA-13 | 4,4'-Bis[N-(2-naphthyl)-N-phenylamino]-biphenyl |
| ATA-14 | 4,4'-Bis[N-(3-acenaphthenyl)-N-phenyl-amino]biphenyl |
| ATA-15 | 1,5-Bis[N-(1-naphthyl)-N-phenylamino]-naphthalene |
| ATA-16 | 4,4'-Bis[N-(9-anthryl)-N-phenylamino]-biphenyl |
| ATA-17 | 4,4''-Bis[N-(1-anthryl)-N-phenylamino]-p-terphenyl |
| ATA-18 | 4,4'-Bis[N-(2-phenanthryl)-N-phenyl-amino]biphenyl |
| ATA-19 | 4,4'-Bis[N-(8-fluoranthenyl)-N-phenyl-amino]biphenyl |
| ATA-20 | 4,4-Bis[N-(2-pyrenyl)-N-phenylamino]bi-phenyl |
| ATA-21 | 4,4'-Bis[N-(2-naphthacenyl)-N-phenyl-amino]biphenyl |
| ATA-22 | 4,4'-Bis[N-(2-perylenyl)-N-phenylamino]-biphenyl |
| ATA-23 | 4,4'-Bis[N-(1-coronenyl)-N-phenylamino]-biphenyl |
| ATA-24 | 2,6-Bis(di-p-tolylamino)naphthalene |
| ATA-25 | 2,6-Bis[di-(1-naphtyl)amino]naphthalene |
| ATA-26 | 2,6-Bis[N-(1-naphthyl)-N-(2-naphthyl)-amino]naphthalene |
| ATA-27 | 4,4''-Bis[N,N-di(2-naphthyl)amino]ter-phenyl |
| ATA-28 | 4,4'-Bis{N-phenyl-N-[4-(1-naphthyl)-phenyl]amino}biphenyl |
| ATA-29 | 4,4'-Bis[N-phenyl-N-(2-pyrenyl)amino]-biphenyl |
| ATA-30 | 2,6-Bis[N,N-di(2-naphthyl)amine]fluorene |
| ATA-31 | 4,4''-Bis(N,N-di-p-tolylamino)terphenyl |
| ATA-32 | Bis(N-1-naphthyl)(N-2-naphthyl)amine |

Any conventional electron injecting and transporting compound or compounds can be employed in forming the layer of the organic electroluminescent medium adjacent the cathode. This layer can be formed by historically taught electroluminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322-334, 1969; and Dresner U.S. Pat. No. 3,710,167.

Among electron injecting and transporting zone compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron injecting and transporting zone compounds which can be used to form the layer adjacent the cathode are optical brighteners, particularly those disclosed by VanSlyke et al U.S. Pat. No. 4,539,507, cited above and here incorporated by reference. Useful optical brighteners include those satisfying structural formulae (VII) and (VIII):

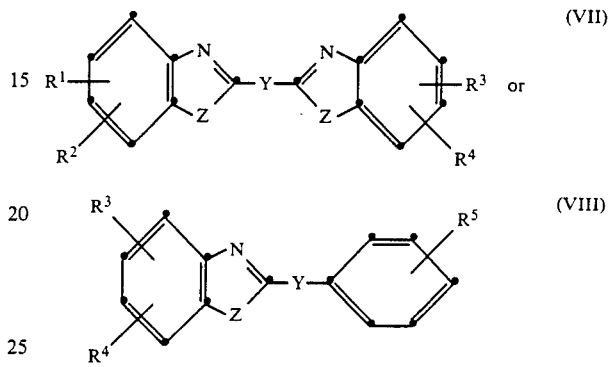

wherein $R^1$, $R^2$, $R^3$, and $R^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VII) at least two of $R^3$, $R^4$ and $R^5$ are saturated aliphatic of from 3 to 10 carbon atoms, e.g., propyl, butyl, heptyl and the like;

Z is —O—, —NH—, or —S—; and

Y is

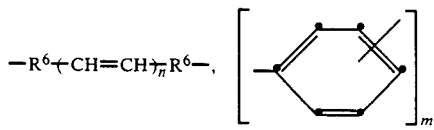

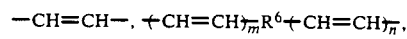

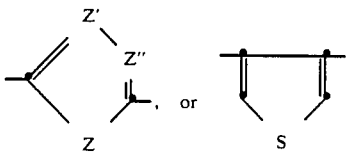

wherein m is an integer of from 0 to 4;

n is arylene of from 6 to 10 carbon atoms, for example, phenylene and naphthylene; and Z' and Z" are individually N or CH. As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618–637 and 640. Those that are not already thin-film-forming can be rendered so by attaching an aliphatic moiety to one or both end rings.

Particularly preferred for use in forming the electron injecting and transporting layers of the organic EL devices of this inventions are metal chelated oxinoid compounds, including chelates of oxine (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (IX):

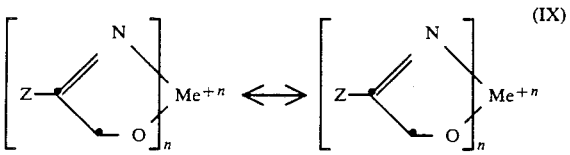

(IX)

wherein

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

| | |
|---|---|
| CO-1 | Aluminum trisoxine |
| | [a.k.a., tris(8-quinolinol) aluminum] |
| CO-2 | Magnesium bisoxine |
| | [a.k.a., bis(8-quinolinol) magnesium] |
| CO-3 | Bis[benzo{f}-8-quinolinol] zinc |
| CO-4 | Aluminum tris(5-methyloxine) [a.k.a., tris(5-methyl-8-quinolinol) aluminum] |
| CO-5 | Indium trisoxine |
| | [a.k.a., tris(8-quinolinol) indium] aluminum |
| CO-6 | Lithium oxine |
| | [a.k.a., 8-quinolinol lithium] |
| CO-7 | Gallium tris(5-chlorooxine) |
| | [a.k.a., tris(5-chloro-8-quinolinol) gallium] |
| CO-8 | Calcium bis(5-chlorooxine) |
| | [a.k.a., bis(5-chloro-8-quinolinol) calcium] |
| CO-9 | Poly[zinc (II)-bis(8-hydroxy5-quinolinyl)methane] |
| CO-10 | Dilithium epindolindione |

In the organic EL devices of the invention it is possible to maintain a current density compatible with efficient light emission while employing a relatively low voltage across the electrodes by limiting the total thickness of the organic luminescent medium to less than 1 $\mu m$ (10,000 Angstroms). At a thickness of less than 1 $\mu m$ an applied voltage of 20 volts results in a field potential of greater than $2 \times 10^5$ volts/cm, which is compatible with efficient light emission. An order of magnitude reduction (to 0.1 $\mu m$ or 1000 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the organic EL device. Even a single pin hole extending through the organic electroluminescent medium will allow shorting to occur. Unlike conventional organic EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chance of pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic electroluminescent medium are each capable of fabrication in the form of a thin film—that is, capable of being fabricated as a continuous layer having a thickness of less than 0.5 $\mu m$ or 5000 Angstroms.

When one or more of the layers of the organic luminescent medium are solvent coated, a film forming polymeric binder can be conveniently co-deposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material binders are preferably limited to less than 50 percent by weight, based on the total weight of the material forming the layer.

The preferred active materials forming the organic electroluminescent medium are both film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer, and a chelated oxinoid compound as an electron injecting and transporting layer, thicknesses in the range of from about 50 to 5000 Angstroms are contemplated, with layer thicknesses in the range of from 100 to 2000 Angstroms being preferred. It is generally preferred that the overall thickness of the organic luminescent medium be at least about 1000 Angstroms.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device. Examples with a number bearing the suffix E represent embodiments of the invention while Examples with a number bearing the suffix C are included for the purpose of comparing variations.

EXAMPLE 1C

Aluminum Capping Layer

An organic EL device containing a three layer organic luminescent medium was constructed in the following manner:

a) A transparent anode of indium tin oxide coated glass was polished with 0.05 μm alumina abrasive for a few minutes, followed by ultrasonic cleaning in a 1:1 (volume) mixture of isopropyl alcohol and distilled water. It was rinsed with isopropyl alcohol and then immersed in toluene vapor for about 5 minutes.

b) A hole injecting PC-10 (350 Å) layer was deposited on the anode by vacuum deposition. PC-10 was evaporated from a quartz boat using a tungsten filament.

c) A hole transporting ATA-1 (350 Å) layer was then deposited on top of the PC-10 layer. ATA-1 was also evaporated from a quartz boat using a tungsten filament.

d) An electron injecting and transporting CO-1 (600 Å) layer was then deposited on top of the ATA-1 layer. CO-1 was also evaporated from a quartz boat using a tungsten filament.

e) On top of the CO-1 layer was deposited a cathode, consisting of a 250 Å electron injecting layer formed of a 10:1 volume ratio of Mg and Al and a 2000 Å Al capping layer.

The cell was encapsulated by placing a glass cover over the cathode and applying Norland 60 ™ optical adhesive around the periphery of the cell, thereby bonding the glass support bearing the anode to the glass cover. When operated immediately following fabrication the cell exhibited no dark spots—i.e., light emission was uniform over the entire anode surface. After 70 days of storage under ambient laboratory conditions (at or near standard temperature and pressure, with humidity varying with weather conditions), operation of the cell revealed that about 25 percent of the total area over which light was initially emitted was occupied by dark spots.

EXAMPLE 2C

Organic Protective Layer

Example 1C was repeated, except that a 2000 Å protective layer of CO-1 was vacuum vapor deposited over the cathode prior to encapsulating the cell. After 70 days of storage under identical conditions as in Example 1C approximately the same percentage of the initial emitting area was occupied by dark spots as in Example 1C. This showed the organic material CO-1 to be ineffective in itself to reduce dark spot formation.

EXAMPLE 3C

Increased Thickness Aluminum Capping Layer

Example 1C was repeated, except that an additional 2000 Å of aluminum was vacuum vapor deposited over the cathode prior to encapsulating the cell. In other words, a total of 4000 Å aluminum was deposited over the Mg:Al electron injecting layer. After 70 days of storage under identical conditions as in Example 1C approximately the same percentage of the initial emitting area was occupied by dark spots as in Example 1C. This showed the additional aluminum to be ineffective in itself to reduce dark spot formation.

EXAMPLE 4C

Aluminum Capping Layer Overcoated with Organic Protective Layer

Example 1C was repeated, except that a 1000 Å protective layer of aluminum was vacuum vapor deposited on the cathode (for a total of 3000 Å aluminum including the capping layer) followed by the vacuum vapor deposition of a 1000 Å protective layer of CO-1 prior to encapsulating the cell. After 70 days of storage under identical conditions as in Example 1C approximately the same percentage of the initial emitting area was occupied by dark spots as in Example 1C. This showed a superimposed combination of a metal protective layer and an organic material protective layer to be ineffective to reduce dark spot formation.

EXAMPLE 5C

No Capping Layer

A cell was constructed identically as in Example 1C, except that no aluminum capping layer was formed over the Mg:Ag electron injecting layer of the cathode. Operation of the cell immediately following fabrication revealed no dark spots. When the cell was operated after being stored for 300 hours at 75° C. and 45% relative humidity, 38.5% of the initially emitting surface area of the cell was found to be occupied by dark spots.

EXAMPLE 6E

Calcium Capping Layer

A cell was constructed and tested identically as in Example 5C, except that a 2000 Å calcium cathode capping layer was vacuum vapor deposited over the cathode electron injecting layer. Operation of the cell immediately following fabrication revealed no dark spots. After 300 hours of storage only 2.6% of the initially emitting surface area of the cell was occupied by dark spots.

EXAMPLE 7E

Strontium Capping Layer

A cell was constructed and tested identically as in Example 5C, except that a 800 Å strontium cathode capping layer was vacuum vapor deposited over the cathode electron injecting layer. Operation of the cell immediately following fabrication revealed no dark spots, and no dark spots were in evidence with the cell was operated after 300 hours of storage.

The invention has been described in detail with particular reference to preferred embodiments thereof, but it will be understood that variations and modifications can be effected within the spirit and scope of the invention.

What is claimed is:

1. An organic electroluminescent device comprised of, in sequence, a support, an anode, an organic electroluminescent medium, and a cathode containing a plurality of metals other than alkali metals,
characterized in that said cathode is comprised of
a capping layer containing at least one alkaline earth metal having a work function of less than 3.5 eV or rare earth metal having a work function of less than 3.5 eV and
interposed between said capping layer and said organic electroluminescent medium, an electron injecting layer containing at least one metal having a work function of less than 4.0, but exhibiting a higher work function than said alkaline earth or rare earth metals in said capping layer.

2. An organic electroluminescent device according to claim 1 further characterized in that said capping layer has a thickness of at least 500 Å.

3. An organic electroluminescent device according to claim 2 further characterized in that said capping layer has a thickness of up to 10 $\mu$m.

4. An organic electroluminescent device according to claim 3 further characterized in that said capping layer has a thickness in the range of from about 1000 Å to 5 $\mu$m.

5. An organic electroluminescent device according to claim 4 further characterized in that said capping layer has a thickness in the range of from about 2000 Å to 2 $\mu$m.

6. An organic electroluminescent device according to claim 1 further characterized in that said electron injecting layer contains a rare earth having a work function in the range of from 3.0 to 3.5 eV and said capping layer contains an alkaline earth or rare earth having a work function of less than 3.0.

7. An organic electroluminescent device according to claim 1 further characterized in that said electron injecting layer contains as its lowest work function metal a metal having its work function in the range range of from 3.5 to less than 4.0 eV.

8. An organic electroluminescent device according to claim 7 further characterized in that said electron injecting layer contains magnesium as its lowest work function metal.

9. An organic electroluminescent device according to claim 8 further characterized in that said electron injecting layer additionally contains a metal having a higher work function than magnesium.

10. An organic electroluminescent device according to claim 8 further characterized in that said capping layer contains an alkaline earth metal other than magnesium as its lowest work function metal.

11. An organic electroluminescent device according to claim 8 further characterized in that said capping layer contains a rare earth metal.

* * * * *